United States Patent
Song et al.

(10) Patent No.: US 10,720,435 B2
(45) Date of Patent: *Jul. 21, 2020

(54) SEMICONDUCTOR DEVICES INCLUDING SUPPORT PATTERNS

(71) Applicant: SAMSUNG ELECTRONICS CO., LTD., Suwon-si, Gyeonggi-do (KR)

(72) Inventors: Jae-Hoon Song, Suwon-si (KR); Kiheum Nam, Osan-si (KR); Wonchul Lee, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/440,399

(22) Filed: Jun. 13, 2019

(65) Prior Publication Data
US 2019/0296022 A1 Sep. 26, 2019

Related U.S. Application Data

(63) Continuation of application No. 15/712,479, filed on Sep. 22, 2017, now Pat. No. 10,340,277.

(30) Foreign Application Priority Data

Dec. 2, 2016 (KR) .................. 10-2016-0163751

(51) Int. Cl.
| | | |
|---|---|---|
| *H01L 27/108* | (2006.01) | |
| *H01L 29/41* | (2006.01) | |
| *H01L 21/768* | (2006.01) | |
| *H01L 23/528* | (2006.01) | |
| *H01L 49/02* | (2006.01) | |
| *H01L 27/02* | (2006.01) | |

(52) U.S. Cl.
CPC .. *H01L 27/10844* (2013.01); *H01L 21/76802* (2013.01); *H01L 21/76838* (2013.01); *H01L 23/528* (2013.01); *H01L 27/10852* (2013.01); *H01L 28/90* (2013.01); *H01L 29/41* (2013.01); *H01L 27/0207* (2013.01)

(58) Field of Classification Search
CPC ........... H01L 27/10844; H01L 27/0207; H01L 29/41; H01L 23/528
See application file for complete search history.

(56) References Cited

U.S. PATENT DOCUMENTS

| | | |
|---|---|---|
| 7,659,602 B2 | 2/2010 | Tegen et al. |
| 7,897,474 B2 | 3/2011 | Eto |
| 8,766,343 B2 | 7/2014 | Kang et al. |

(Continued)

FOREIGN PATENT DOCUMENTS

| | | |
|---|---|---|
| KR | 10-2009-0044553 A | 5/2009 |
| KR | 10-2014-0065186 A | 5/2014 |

*Primary Examiner* — Mark V Prenty
(74) *Attorney, Agent, or Firm* — Lee IP Law, P.C.

(57) ABSTRACT

A semiconductor device includes a plurality of pillar structures on a semiconductor substrate, and a support pattern in contact with at least a part of each of the pillar structures, the support pattern connecting the pillar structures with one another, wherein the support pattern includes support holes exposing side surfaces of the pillar structures, the support holes including at least a first support hole and a second support hole that are spaced apart from each other, the first and second support holes having different shapes from each other.

20 Claims, 13 Drawing Sheets

(56) References Cited

U.S. PATENT DOCUMENTS

| | | |
|---|---|---|
| 8,779,549 B2 | 7/2014 | Kim et al. |
| 9,087,729 B2 | 7/2015 | Park et al. |
| 9,142,558 B2 | 9/2015 | Yang et al. |
| 9,276,058 B2 | 3/2016 | Lee et al. |
| 10,340,277 B2 * | 7/2019 | Song ........................ H01L 28/90 |
| 2018/0158829 A1 | 6/2018 | Song et al. |

* cited by examiner

SEMICONDUCTOR DEVICES INCLUDING SUPPORT PATTERNS

CROSS-REFERENCE TO RELATED APPLICATIONS

This is a continuation application based on pending application Ser. No. 15/712,479, filed Sep. 22, 2017, the entire contents of which is hereby incorporated by reference.

Korean Patent Application No. 10-2016-0163751 filed on Dec. 2, 2016, in the Korean Intellectual Property Office, and entitled: "Semiconductor Devices Including Support Patterns," is incorporated by reference herein in its entirety.

BACKGROUND

1. Field

The present disclosure relates to a semiconductor device including a support pattern.

2. Description of the Related Art

Semiconductor devices are considered to be an important factor in electronic industry because of their small size, multi-function, and/or low fabrication cost. The semiconductor devices are being highly integrated with the development of the electronic industry, e.g., line widths of patterns of the semiconductor devices are reduced for high integration of the semiconductor devices. However, new exposure techniques and/or expensive exposure techniques are required to reduce line widths of the patterns to facilitate high integration of the semiconductor devices. Thus, research has been conducted for new integration techniques, e.g., to bury word lines inside a semiconductor substrate in dynamic random-access memory (DRAM) memory devices.

SUMMARY

According to exemplary embodiments, a semiconductor device may include a plurality of pillar structures on a semiconductor substrate, and a support pattern in contact with at least a part of each of the plurality of pillar structure, the support pattern connecting the plurality of pillar structures with one another, wherein the support pattern includes support holes exposing side surfaces of the pillar structures, the support holes including at least a first support hole and a second support hole that are spaced apart from each other, the first and second support holes having different shapes from each other.

According to exemplary embodiments, a semiconductor device may include a plurality of pillar structures on a semiconductor substrate, the semiconductor substrate including a cell region and a dummy region, and a support pattern in contact with at least a part of each of the pillar structures, the support pattern connecting the pillar structures with one another, wherein the support pattern includes support holes exposing side surfaces of the pillar structures, the support holes including a plurality of first support holes and at least one second support hole that are spaced apart from each other, wherein the plurality of first support holes have a different shape from that of the at least one second support hole, and wherein the support holes are on the cell region.

According to exemplary embodiments, a semiconductor device may include a plurality of electrode pillars on a semiconductor substrate, and a support pattern in contact with at least a part of each of the plurality of electrode pillars, the support pattern connecting the plurality of electrode pillars with one another, wherein the support pattern includes support holes therethrough, the support holes including at least a first support hole and a second support hole that are spaced apart from each other, the first and second support holes having different shapes from each other in plan view.

BRIEF DESCRIPTION OF THE DRAWINGS

Features will become apparent to those of ordinary skill in the art by describing in detail exemplary embodiments with reference to the attached drawings, in which.

DETAILED DESCRIPTION OF EMBODIMENTS

Exemplary embodiments will be described hereinafter in detail in conjunction with the accompanying drawings.

Figure 1:
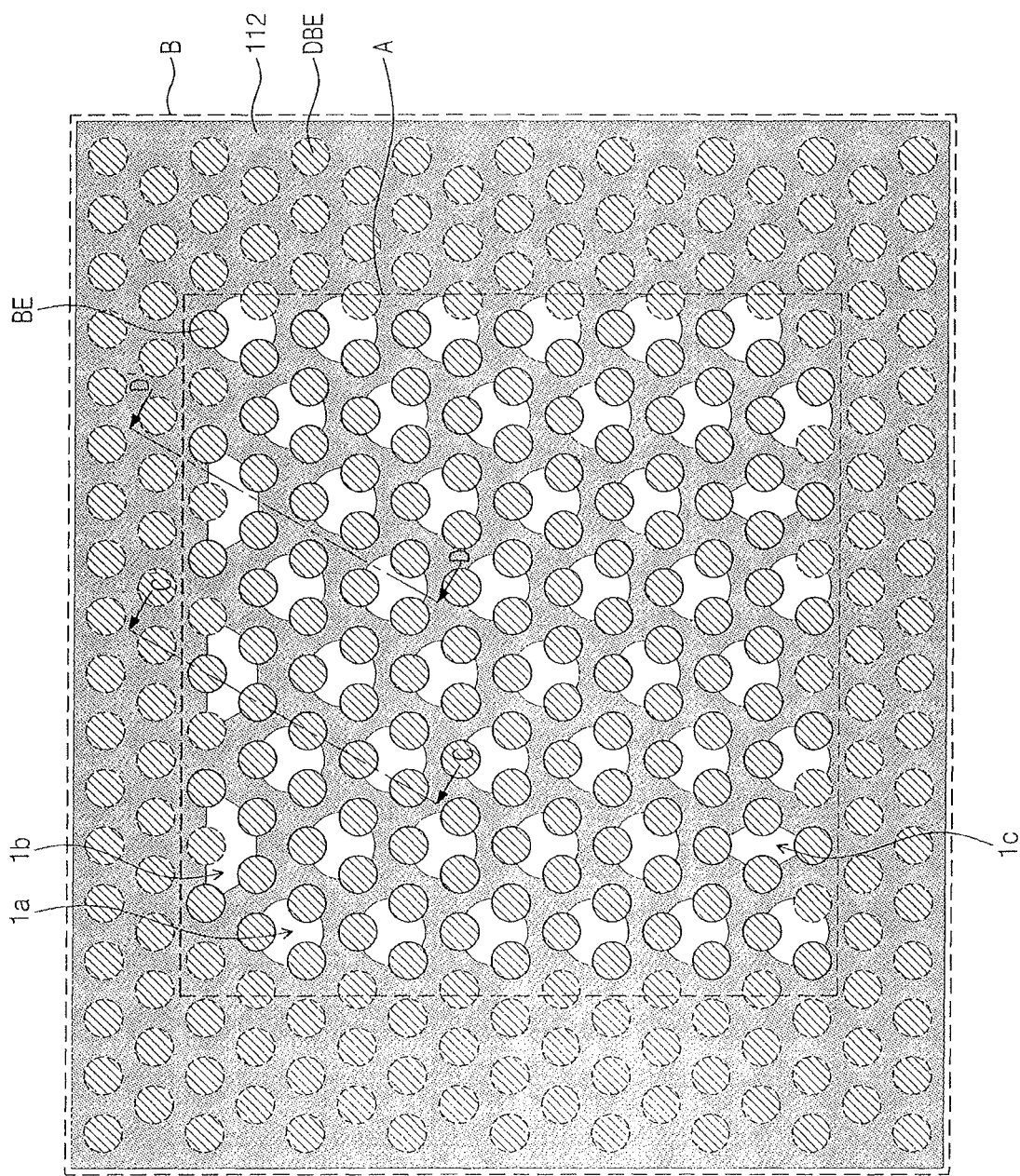
FIG. 1 illustrates a plan view of a semiconductor device according to exemplary embodiments.
Figure 2:
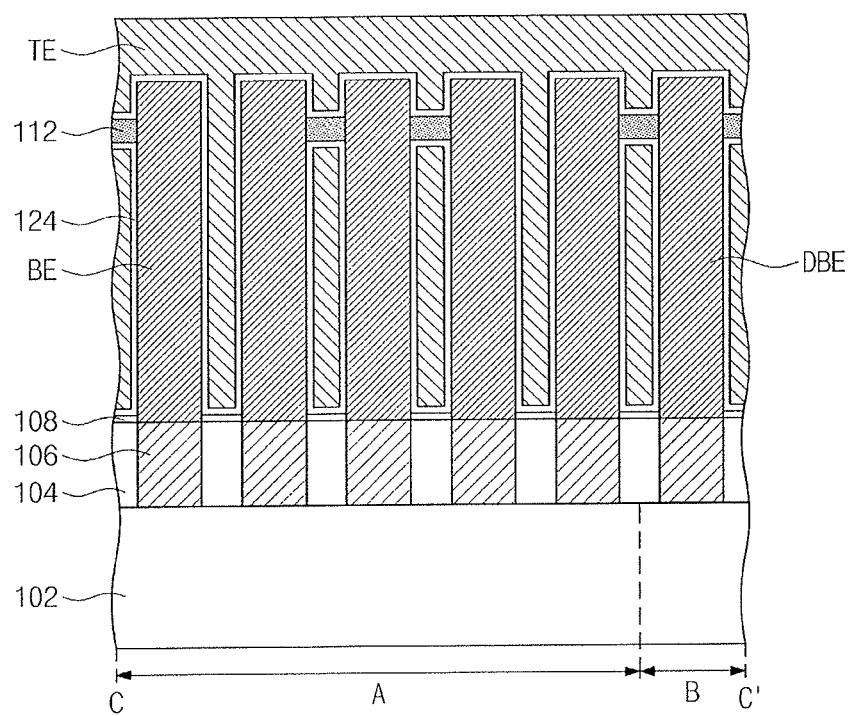
FIG. 2 illustrates a cross-sectional view taken along line C-C' of FIG. 1.
Figure 3:
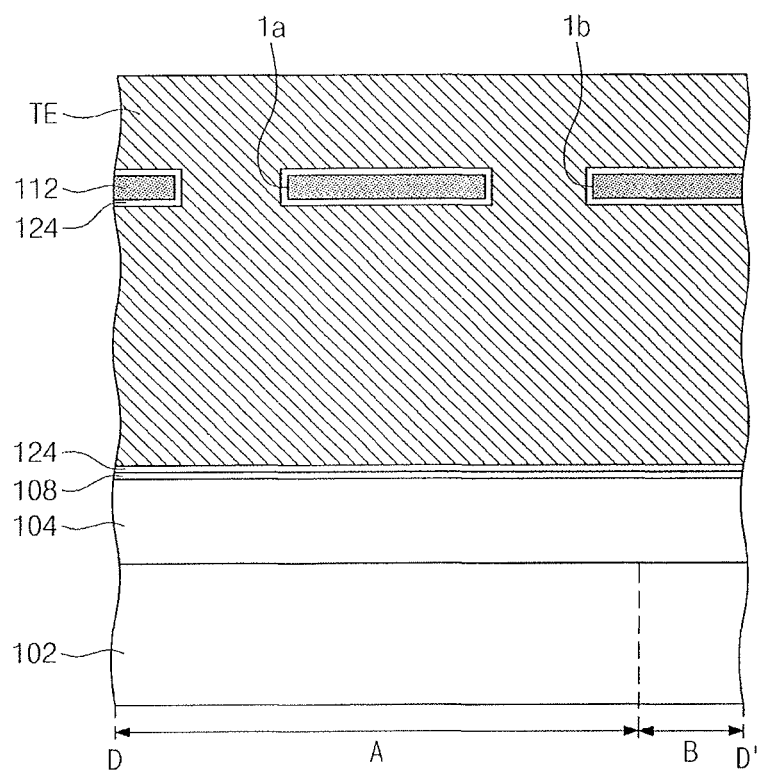
FIG. 3 illustrates a cross-sectional view taken along line D-D' of FIG. 1.
Figure 4:
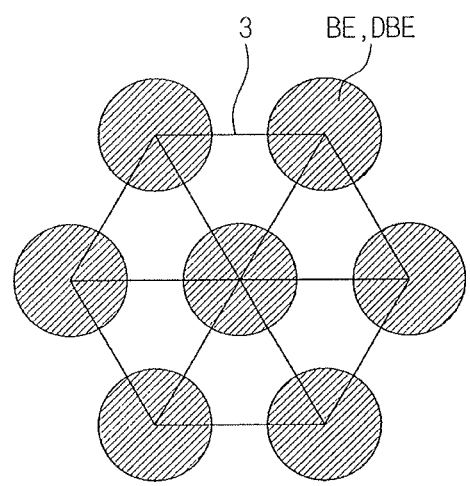
FIG. 4 illustrates a plan view of an arrangement of bottom electrodes of FIG. 1.

FIG. 1 is a plan view illustrating a semiconductor device according to exemplary embodiments. FIG. 2 is a cross-sectional view taken along line C-C' of FIG. 1. FIG. 3 is a cross-sectional view taken along line D-D' of FIG. 1. FIG. 4 is a plan view illustrating an arrangement of lower electrodes of FIG. 1.

Referring to FIGS. 1 to 4, a semiconductor substrate 102 may be provided. The semiconductor substrate 102 may include an actual cell region A and a dummy cell region B. The dummy cell region B may surround the actual cell region A, as illustrated in FIG. 1. The actual cell region A and the dummy cell region B may be disposed on a memory block section of a cell array area. A peripheral circuit area or a core area may be located outside the dummy cell region B. The actual cell region A may be a region where actual memory cells are arranged and operated. The dummy cell region B may have a structure similar to that of the actual cell region A and be a region where inoperable dummy memory cells are arranged. The dummy memory cells may be formed to prevent pattern shapes, e.g., in the actual cell region A, from being distorted due to interference or diffraction of light at an edge area of a cell memory region during a photolithography process. In addition, in an etch process, the cell memory region may have a different etching condition in its edge area than in its central area, e.g., thereby causing an electrical bridge between patterns. Accordingly, the dummy memory cells may be formed to make the edge area of the cell memory region to have the same etching condition as that in the central area of the cell memory region, e.g., the dummy cell region B may be the edge area of the actual cell region A to facilitate a same etching condition through the entire actual cell region A.

The semiconductor substrate 102 may be, e.g., a single crystalline silicon substrate. An interlayer dielectric layer 104 may be disposed on the semiconductor substrate 102. The interlayer dielectric layer 104 may be formed of, e.g., a silicon oxide layer. A plurality of bottom electrode contacts 106 penetrate the interlayer dielectric layer 104 to be electrically connected to the semiconductor substrate 102. The bottom electrode contacts 106 may include at least one of an impurity-doped polysilicon pattern, a titanium nitride layer, and a tungsten layer.

Although not shown in the figures, the semiconductor substrate 102 may be provided therein with a device isolation layer defining active regions. Word lines may be buried in the semiconductor substrate 102. A gate dielectric layer and a capping pattern may insulate the word lines from the semiconductor substrate 102. Source/drain regions may be provided to include impurity regions disposed in the semiconductor substrate 102 on opposite sides of each of the word lines. The impurity regions on sides of the word lines may be electrically connected to corresponding bit lines. The bottom electrode contacts 106 may be electrically connected to the impurity regions on other sides of the word lines.

An etch stop layer 108 may be disposed on the interlayer dielectric layer 104. The etch stop layer 108 may be formed of, e.g., a silicon nitride layer. Bottom electrodes BE and DBE penetrate the etch stop layer 108 to be in contact with corresponding bottom electrode contacts 106, respectively. In this description, the bottom electrodes BE disposed on the actual cell region A are named as referred to as actual bottom electrodes BE, and the bottom electrodes DBE disposed on the dummy cell region B are referred to as dummy bottom electrodes DBE. It is noted that in FIG. 1 the actual bottom electrode BE is illustrated by a solid border line and the dummy bottom electrode DBE is illustrated by a dotted border line. Some of the dummy bottom electrodes DBE may be arranged on the actual cell region A, and disposed on an edge portion of the actual cell region A so as to be adjacent to the dummy cell region B. All of the bottom electrodes BE and DBE may have the same shape and be formed of the same material. For example, the bottom electrodes BE and DBE may be formed of titanium nitride or impurity-doped polysilicon.

The bottom electrodes BE and DBE may be electrode pillars, i.e., pillar structures. That is, the bottom electrodes BE and DBE may have a pillar shape with a circular cross-section in plan view and a plug shape without an internal cavity in a cross-sectional view (FIG. 2). The bottom electrodes BE and DBE may include memory pillar structures on the actual cell region A and dummy pillar structures on the dummy cell region B, respectively. The memory pillar structures may perform memory functions, while the dummy pillar structures may not perform memory functions.

Referring to FIG. 4, the bottom electrodes BE and DBE may be spaced apart from each other at the same interval. That is, the bottom electrodes BE and DBE may have a cross-section of a circle in plan view, and straight lines 3 connecting central points of most adjacent circles may be the same, e.g., distances between central points of every two adjacent circles may be the same. A hexagonal honeycomb shape may be obtained when connecting the central points of six bottom electrodes BE and DBE surrounding a central bottom electrode BE or DBE. As the bottom electrodes BE and DBE are spaced apart from each other at the same interval, a dielectric layer and a top electrode layer may be formed to have a uniform thickness in subsequent processes.

As illustrated in FIGS. 1-2, the bottom electrodes BE and DBE may have an upper sidewall in contact with a support pattern 112, e.g., the support pattern 112 may extent to contact upper portions of upper sidewalls of adjacent ones of the bottom electrodes BE and DBE to support the bottom electrodes BE and DBE. The support pattern 112 may be formed of, e.g., a silicon nitride layer. The support pattern 112 may be in contact with sidewalls of all of the bottom electrodes BE and DBE. The support pattern 112 may include support holes 1a, 1b, and 1c, as shown in FIG. 1. It is noted that that support pattern 112 is indicated in solid gray in FIG. 1.

In detail, as illustrated in FIG. 1, the support holes 1a, 1b, and 1c may be disposed on the actual cell region A, but not on the dummy cell region B. That is, the support holes 1a, 1b, and 1c may be disposed only on the actual cell region A, so no support holes 1a, 1b, and 1c (or portions thereof) may be on the dummy cell region B. In the actual cell region A, the support holes 1a, 1b, and 1c may partially expose side surfaces of all of the actual bottom electrodes BE, e.g., the support holes 1a to 1c may be formed so that a portion of a side surface of each of the actual bottom electrodes BE faces the support hole. The support holes 1a, 1b, and 1c may expose some dummy electrodes DBE arranged on the actual cell region A.

The support holes 1a, 1b, and 1c may include a first hole 1a, a second hole 1b, and a third hole 1c. The first to third holes 1a to 1c may have different planar shapes from each other. The first hole 1a may be provided in plural. The first hole 1a may be a major hole occupying most of the support holes 1a, 1b, and 1c, e.g., a majority of support holes of the total of the support holes 1a to 1c are the first holes 1a. For example, a total number of the first support holes 1a may be larger than that of the second support holes 1b and/or third support holes 1c. The first holes 1a may be arranged on a central portion of the actual cell region A. Some of the first holes 1a may also be disposed on the edge portion of the actual cell region A. The actual cell region A may be provided at its edge portion with at least one second and third holes 1b and 1c.

FIGS. 5 to 11 are plan views illustrating a relationship between the bottom electrodes BE, DBE and the support pattern holes 1a through 1c.

Figure 5:
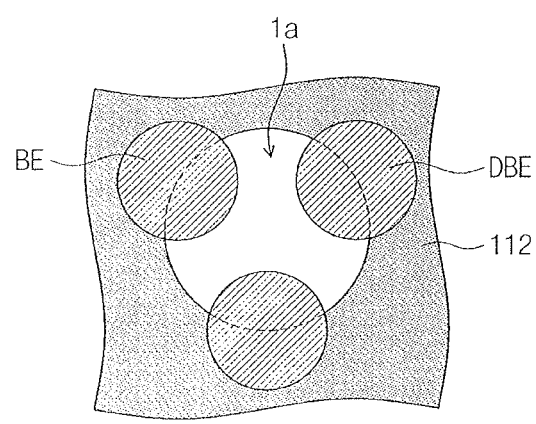
FIGS. 5 to 11 illustrate plan views of a relationship between bottom electrodes and a support pattern hole.

Referring to FIG. 5, a circle may be obtained in plan view when connecting a sidewall of the first hole 1a with central points of the bottom electrodes BE and DBE exposed through the first hole 1a. For example, the first hole 1a may have a cross-section of a circle in a plan view, with a perimeter of the circle extending through central points of three adjacent bottom electrodes BE and DBE, and with a center of the circle being in a center of a region between the three adjacent bottom electrodes BE and DBE. The first hole 1a may partially expose sidewalls of the three adjacent bottom electrodes BE and DBE.

Figure 6:
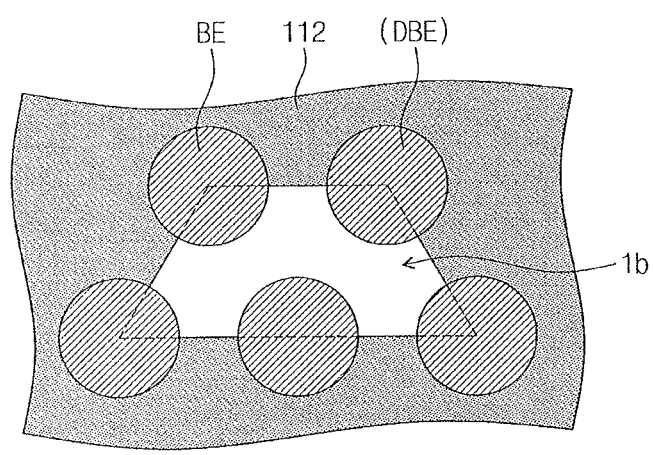

Referring to FIG. 6, a quadrangle connecting five bottom electrodes BE and DBE may be obtained in plan view when connecting a sidewall of the second hole 1b with central points of the bottom electrodes BE and DBE exposed through the second hole 1b. For example, the second hole 1b may have a cross-section of a trapezoid in a plan view, with a first side of the trapezoid connecting central points of two adjacent bottom electrodes BE and DBE, and a second side of the trapezoid parallel to the first side and connecting central points of three adjacent bottom electrodes BE and DBE. The second hole 1b may partially expose sidewalls of five bottom electrodes BE and DBE.

Figure 7:
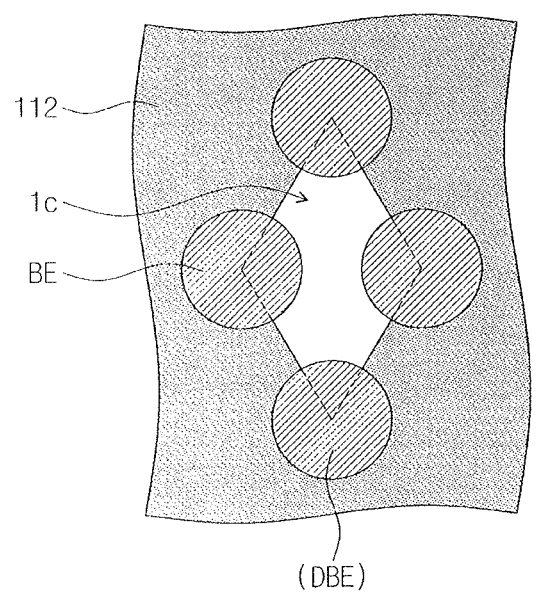

Referring to FIG. 7, a quadrangle connecting four bottom electrodes BE and DBE may be obtained in plan view when connecting a sidewall of the third hole 1c with central points of the bottom electrodes BE and DBE exposed through the third hole 1c. For example, the third hole 1c may have a cross-section of a rhombus in a plan view, with each side of the rhombus connecting central points of two adjacent bottom electrodes BE and DBE.

The support holes 1a, 1b, and 1c may not be limited thereto but variously changed. This will be described below with reference to FIGS. 8-11.

Figure 8:
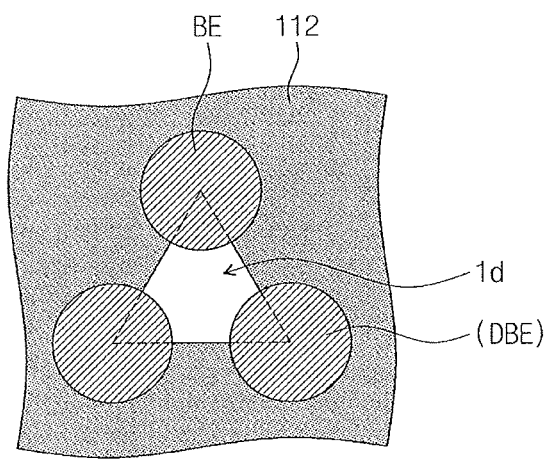

Referring to FIG. 8, the support pattern 112 may include a fourth hole 1d. An equilateral triangle may be obtained in plan view when connecting a sidewall of the fourth hole 1d with central points of the bottom electrodes BE and DBE exposed through the fourth hole 1d. For example, the fourth hole 1d may have a cross-section of an equilateral triangle in a plan view, with each side of the equilateral triangle connecting central points of two adjacent bottom electrodes BE and DBE.

Figure 9:
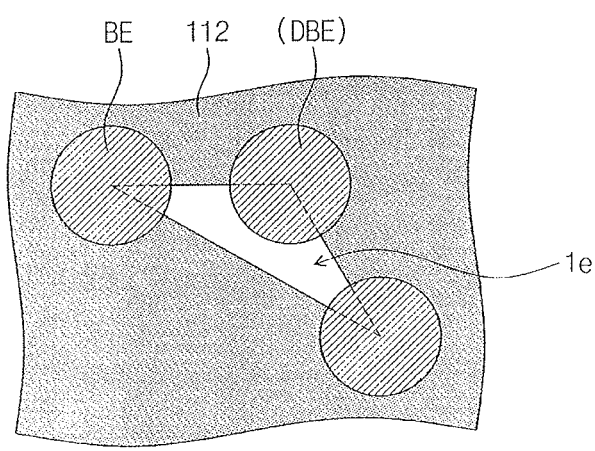

Referring to FIG. 9, the support pattern 112 may include a fifth hole 1e. An isosceles triangle (with one angle of 120°) may be obtained in plan when connecting a sidewall of the fifth hole 1e with central points of the bottom electrodes BE and DBE exposed through the fifth hole 1e. For example, the fifth hole 1e may have a cross-section of an isosceles triangle in a plan view, with each side of the equilateral triangle connecting central points of two adjacent bottom electrodes BE and DBE.

Figure 10:
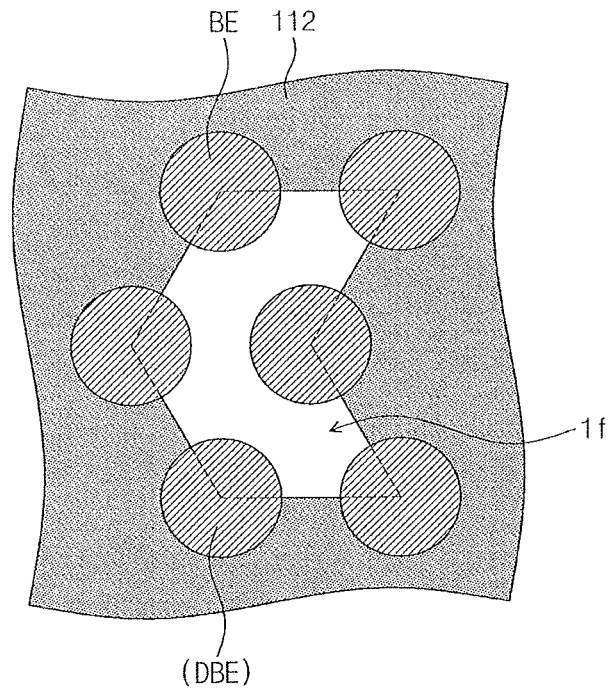

Referring to FIG. 10, the support pattern 112 may include a sixth hole 1f. A distorted hexagon may be obtained in plan when connecting a sidewall of the sixth hole 1f with central points of the bottom electrodes BE and DBE exposed through the sixth hole 1f. For example, the sixth hole 1f may have a cross-section of a distorted hexagon in a plan view, with each side of the hexagon connecting central points of two adjacent bottom electrodes BE and DBE.

Figure 11:
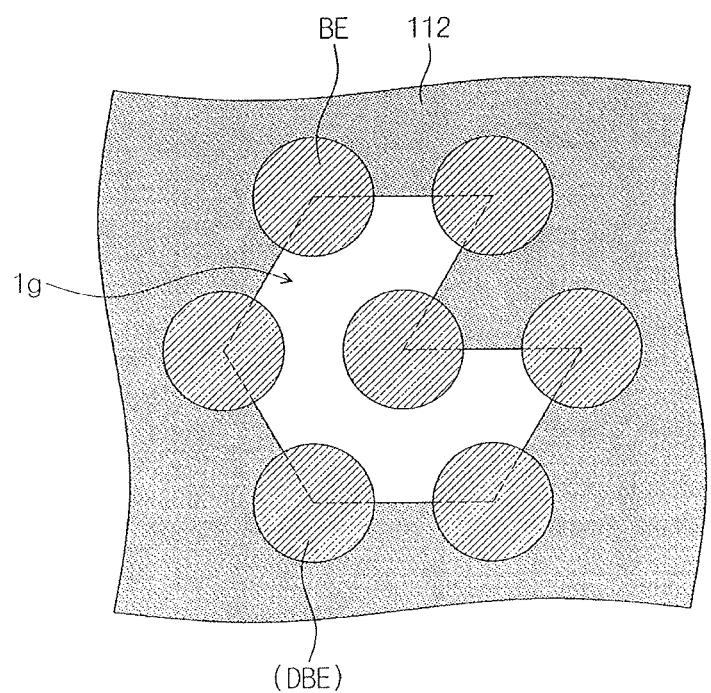

Referring to FIG. 11, the support pattern 112 may include a seventh hole 1g. A distorted heptagon may be obtained in plan when connecting a sidewall of the seventh hole 1g with central points of the bottom electrodes BE and DBE exposed through the seventh hole 1g. For example, the seventh hole 1g may have a cross-section of a distorted heptagon in a plan view, with each side of the heptagon connecting central points of two adjacent bottom electrodes BE and DBE.

At least one of the second to seventh holes 1b to 1g may be disposed on the edge portion of the actual cell region A in the support pattern 112 of FIG. 1. One of the support holes 1a to 1g may partially expose the sidewalls of three to seven bottom electrodes BE and DBE at the same time. The number of the support holes 1a to 1g may be at least one.

Referring back to FIG. 2, a dielectric layer 124 may conformally cover exposed surfaces of the support pattern 112 and exposed surfaces of the bottom electrodes BE and DBE, and a top electrode layer TE may be formed on dielectric layer 124, e.g., to fill a space between the bottom electrodes BE and DBE and extend above the bottom electrodes BE and DBE. That is, the support holes 1a, 1b, and 1c partially expose side surfaces of all of the actual bottom electrodes BE during manufacturing stages, so the dielectric layer 124 may conformally cover the exposed surfaces of the bottom electrodes BE and DBE that face the support holes. For example, FIG. 2 illustrates a portion of a first support hole 1a (between the two most left actual bottom electrodes BE) filled with the dielectric layer 124 and the top electrode layer TE. The dielectric layer 124 may be formed of, e.g., a metal oxide layer such as an aluminum oxide layer, which exhibits a dielectric constant greater than that of a silicon oxide layer. The top electrode layer TE may be formed of at least one of, e.g., a titanium nitride layer, a tungsten layer, an impurity-doped polysilicon layer, and an impurity-doped silicon germanium layer.

As discussed above, in a semiconductor device according to an exemplary embodiment, the support pattern 112 supporting the bottom electrodes BE and DBE may include at least one of the support holes 1a to 1g having different shapes from each other, e.g., at least two of the support holes in the support pattern 112 may have shapes that are different from each other. As such, without extending into the dummy cell region B, the support holes 1a to 1g may all be positioned in the actual cell region A to expose side surfaces of all of the actual bottom electrodes BE serving as a memory on the actual cell region A. In addition, as shapes of the support holes in the support pattern 112 are not all identical to each other, at least one of the shapes of the support holes in the support pattern 112 may be adjusted to ensure that all of the support holes of the support pattern 112 are within the actual cell region A without extending into the dummy cell region B, thereby eliminating a need to horizontally extend a width of the support pattern 112 into a peripheral circuit area. Further, as the support holes 1a to 1g expose the side surfaces of all of the actual bottom electrodes BE in the actual cell region A, the dielectric layer 124 and the top electrode layer TE may be deposited to have a uniform thickness without collapse of the bottom electrodes BE.

Figure 12:
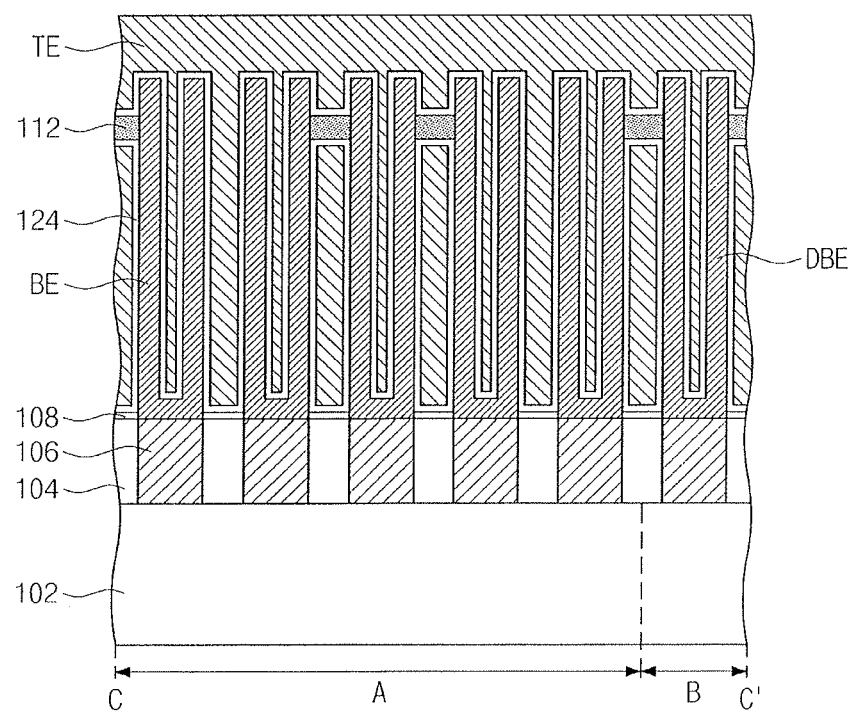
FIG. 12 illustrates a cross-sectional view of a semiconductor device according to other exemplary embodiments along line C-C' of FIG. 1.

FIG. 12 illustrates a cross-sectional view of a semiconductor device according to other exemplary embodiments along line C-C' of FIG. 1. Referring to FIG. 12, the bottom electrodes BE and DBE may have a hollow cup shape. The dielectric layer 124 and the top electrode layer TE may also be formed to conform to internal surfaces of the bottom electrodes BE and DBE.

FIGS. 13 to 16 are cross-sectional views illustrating stages in a method of fabricating a semiconductor device having the cross-section of FIG. 2. FIG. 17 is a plan view illustrating a mask pattern used for forming a support pattern hole according to exemplary embodiments.

Figure 13:
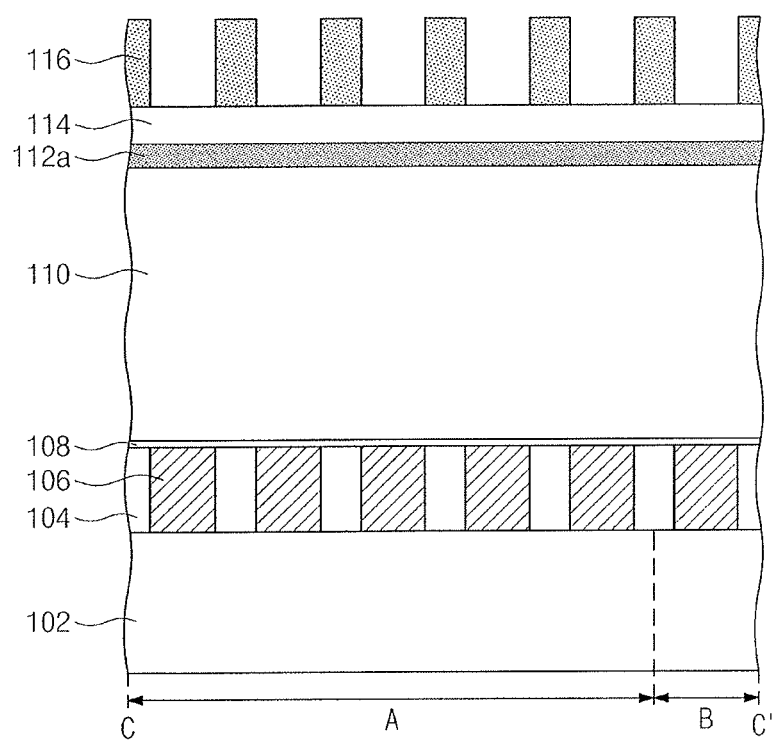
FIGS. 13 to 16 illustrate cross-sectional views of stages in a method of fabricating a semiconductor device having the cross-section of FIG. 2.

Referring to FIG. 13, the semiconductor substrate 102 may be provided. Although not shown in figures, active regions may be defined by forming a device isolation layer in the semiconductor substrate 102. Word lines may be formed in the semiconductor substrate 102. The word lines may be insulated from the semiconductor substrate 102 through a gate dielectric layer and a capping pattern. Impurity regions may be formed in the semiconductor substrate 102 on opposite sides of each of the word lines. Bit lines may be formed on the semiconductor substrate 102 and thus electrically connected to the impurity regions on the sides of the word lines.

The interlayer dielectric layer 104 may be formed on the semiconductor substrate 102. The interlayer dielectric layer 104 may be etched to form contact holes exposing the impurity regions on the sides of the word lines in the substrate 102, and the contact holes may be filled with a conductive material, followed by a planarization process of the conductive material to form the bottom electrode contacts 106, e.g. tops of the bottom electrode contacts 106 may be level with a top of the interlayer dielectric layer 104.

The etch stop layer 108 may be formed on the interlayer dielectric layer 104 and on the bottom electrode contacts 106. A first mold layer 110, a support layer 112a, and a second mold layer 114 may be sequentially formed on, e.g., directly on, the etch stop layer 108. The etch stop layer 108 may be formed of a material having an etch selectivity with respect to the first mold layer 110. For example, the etch stop layer 108 may be formed of a silicon nitride layer, and the first and second mold layers 110 and 114 may be formed of a silicon oxide-based material. When polysilicon is not used to form bottom electrodes BE and DBE which will be discussed below, the first and second mold layers 110 and 114 may be formed of a polysilicon layer or a silicon germanium layer. The support layer 112a may be formed of, e.g., a silicon nitride layer. A first mask pattern 116 may be formed on the second mold layer 114 so as to define openings for bottom electrode holes which will be discussed below, e.g., the openings of the mask patterns 116 may overlap the bottom electrode contacts 106. The first mask pattern 116 may include, e.g., a photoresist pattern.

Figure 14:
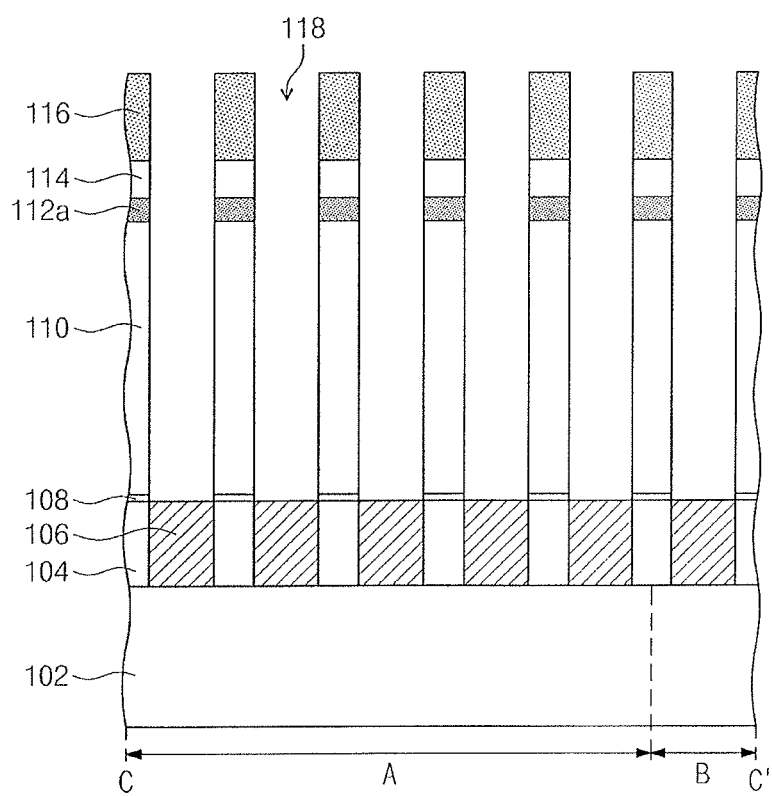

Referring to FIG. 14, the first mask pattern 116 may be used as an etch mask to sequentially pattern the second mold layer 114, the support layer 112a, and the first mold layer 110, thereby exposing the etch stop layer 108. Then, the exposed etch stop layer 108 may be etched to form bottom electrode holes 118 exposing top surfaces of the bottom electrode contacts 106.

Figure 15:
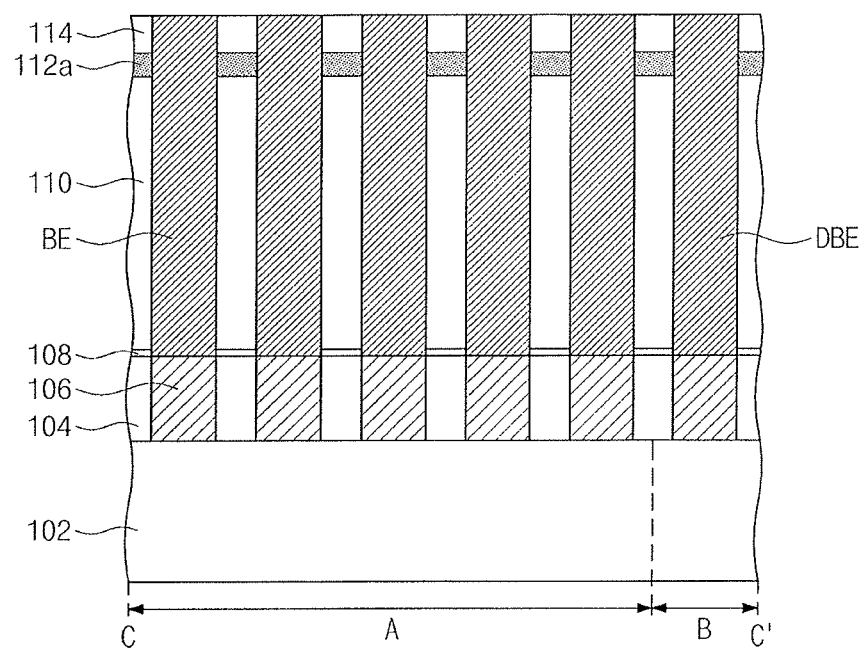

Referring to FIG. 15, the first mask pattern 116 may be removed. For example, when the first mask pattern 116 is formed of a photoresist pattern, an ashing process may be employed to remove the first mask pattern 116. Thus, a top surface of the second mold layer 114 may be exposed. Subsequently, a conductive layer may be formed, e.g., stacked, in the bottom electrode holes 118, e.g., to completely fill the bottom electrode holes 118, followed by a planarization etch process on the conductive layer to expose the top surface of the second mold layer 114, and simultaneously, to form bottom electrodes BE, DBE in corresponding bottom electrode holes 118.

Figure 16:
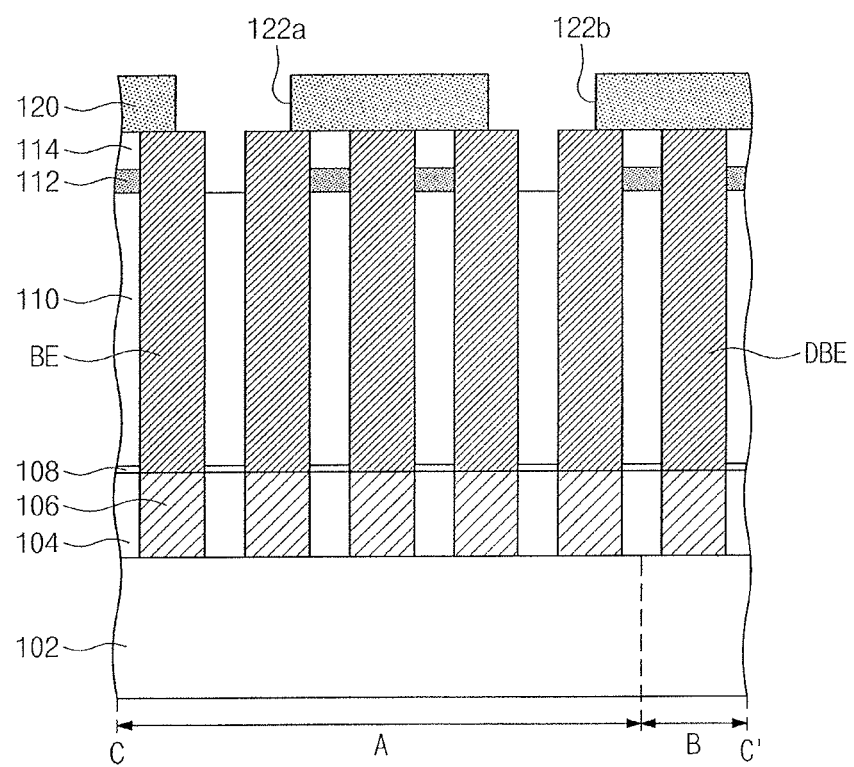
Figure 17:
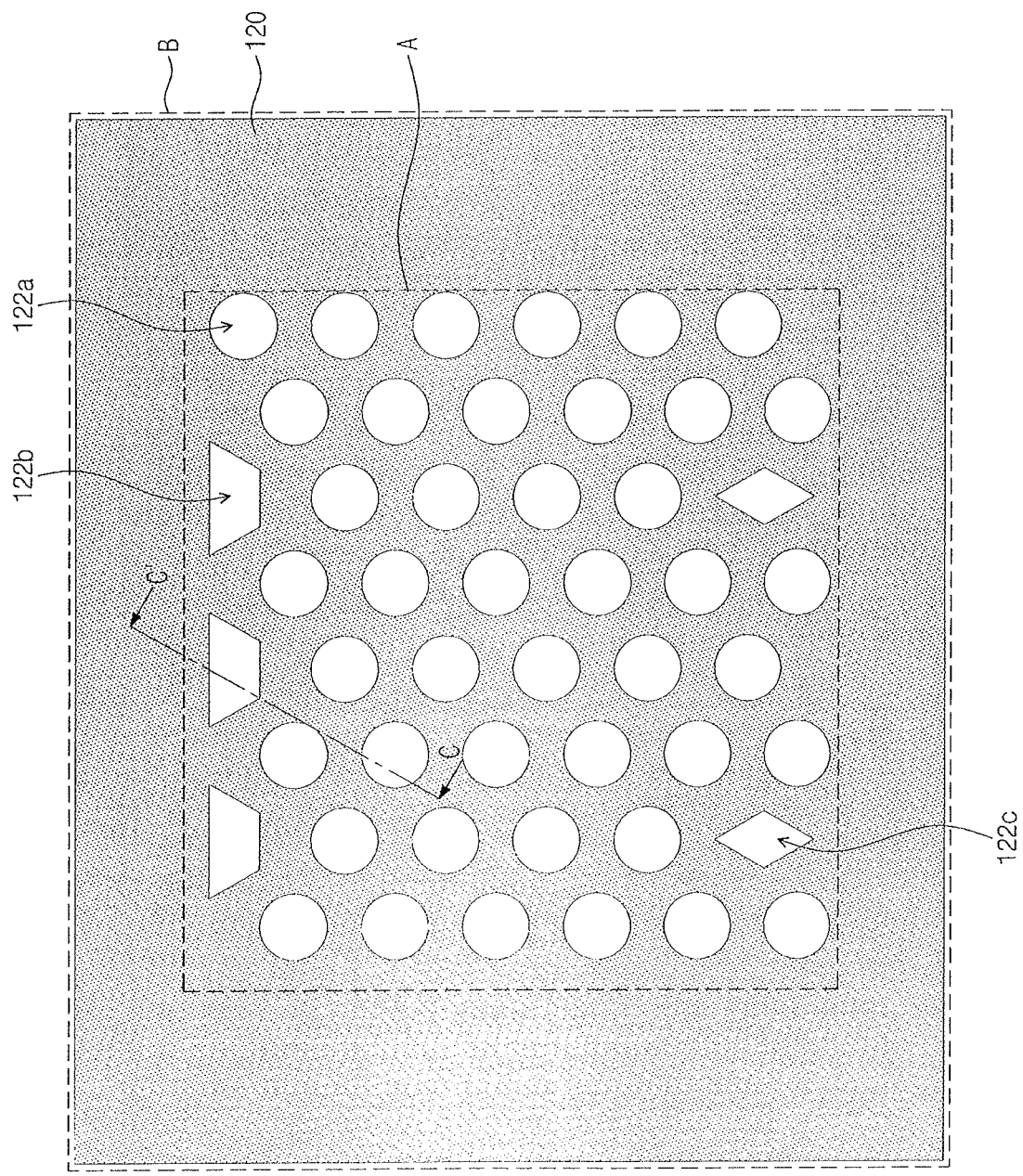
FIG. 17 illustrates a plan view of a mask pattern used for forming a support pattern hole according to exemplary embodiments.

Referring to FIGS. 16 and 17, a second mask pattern 120 may be formed on the bottom electrodes BE, DBE, and on the second mold layer 114. The second mask pattern 120 may have openings defining shapes of the support holes 1a to 1g disclosed in FIGS. 1 and 5 to 11. For example, when only the first to third support holes 1a to 1c are included in the support pattern 112 discussed below, the second mask pattern 120 may include first, second, and third mask holes 122a, 122b, and 122c having shapes and positions correspond to those of the first to third support holes 1a to 1c. For example, as illustrated in FIG. 17, the first mask hole 122a may have a circular shape, the second mask hole 122b may have a trapezoidal shape, and the third mask hole 122c may have a rhombus shape. The first to third mask holes 122a, 122b, and 122c may be positioned to overlap only portions of the actual cell region A. As the second and third mask holes 122b and 122c have shapes, e.g., polygonal shapes, different from that (i.e., the circular shape) of the first mask hole 122a, the first to third mask holes 122a, 122b, and 122c may be disposed only in the actual cell region A.

A photolithography process may be performed to form the first to third mask holes 122a to 122c in the second mask pattern 120 according to embodiments. In general, accounting for a process margin of the photolithography process, which may potentially cause some of the mask holes at least partially extend into, e.g., overlap, a dummy cell region, a horizontal width of the support pattern may be extended toward a peripheral area or a core area. That is, accounting for the process margin of the photolithography process, if all of the mask holes were to have the same shape (e.g., circle), some of such mask holes would extend into, e.g., at least partially overlap, the dummy cell region in order to expose sidewalls of all of the actual bottom electrodes BE, thereby requiring the horizontal width of the support pattern to extended toward a peripheral area or a core area.

However, according to example embodiments, some shapes of the mask holes at edges of the actual cell region A, e.g., the second and third mask holes 122b and 122c, may be modified to be other than circular in order to remain positioned within, the actual cell region A, while also exposing sidewalls of all of the actual bottom electrodes BE. IN other words, as all of the first to third mask holes 122a to 122c are positioned within the actual cell region A, i.e., none of the first to third mask holes 122a to 122c extends beyond the actual cell region A, due to the different shapes of the first to third mask holes 122a to 122c, the horizontal width of the support pattern 122 does not have to be extended, thereby facilitating high integration.

The second mask pattern 120 may be used as an etch mask to remove portions of the second mold layer 114 exposed through the first to third mask holes 122a to 122c and to also remove portions of the support layer 112 below the removed second mold layer 114. As a result, a top surface of the first mold layer 110 may be exposed through the resultant opening, and at the same time, the support pattern 112 may be formed to include the first to third support holes 1a to 1c of FIG. 1.

Referring back to FIGS. 1 and 3, the second mask pattern 120 may be removed to expose some of a side surface of the bottom electrodes BE and DBE, tops of remaining portions of the second mold layer 114, and the top surface of the first mold layer 110. An isotropic etch process may be performed to completely remove the first and second mold layers 110 and 114 to expose top and side surfaces of the bottom electrodes BE and DBE, a top surface of the etch stop layer 108, and top, bottom, and side surfaces of the support pattern 112, e.g., FIG. 3 illustrates portions of the support pattern 112 having side surfaces exposed through the support holes. In this step, the support pattern 112 contacts upper portions of sidewalls of, e.g., connects adjacent ones of, the bottom electrodes BE and DBE to prevent collapse of the bottom electrodes BE and DBE. As the support holes 1a to 1c partially expose the side surfaces of all of the actual bottom electrodes BE, an etchant or etching gas may be provided through the support holes 1a to 1c toward the side surfaces of all of the actual bottom electrodes BE. Therefore, regardless of position in the actual cell region A, the first and second mold layers 110 and 114 may be, e.g., completely, removed at a uniform concentration profile or etch rate in the vicinity of the side surfaces of the actual bottom electrodes BE. Thus, it may be possible to prevent some of the actual bottom electrodes BE from being excessively damaged.

The dielectric layer 124 may conformally cover exposed surfaces of the support pattern 112 and exposed surfaces of the bottom electrodes BE and DBE, and the top electrode layer TE may be sequentially formed on the dielectric layer 124. A semiconductor device may therefore be fabricated to have high integration and reliability.

By way of summation and review, embodiments provide a highly integrated semiconductor device. That is, in a semiconductor device according to exemplary embodiments, the support pattern supporting the bottom electrodes may include support holes having different shapes from each other. As such, the support holes may expose side surfaces of all of actual bottom electrodes serving as a memory on an actual cell region without extending into a dummy cell region. In addition, as the support holes are formed all within the actual cell region, a width of the support pattern does not require extension toward a peripheral circuit area. Further, the support holes may be used to selectively remove mold layers without damage to the bottom electrodes. A dielectric layer and a top electrode layer may be formed to have a uniform thickness on the actual cell region. It may thus be achieved that a semiconductor device is fabricated to have high integration and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   bottom electrodes on a semiconductor substrate, the semiconductor substrate including a cell region and a dummy region; and
   a support pattern in contact with at least a part of each of the bottom electrodes, the support pattern connecting the bottom electrodes with one another,
   wherein the support pattern includes support holes exposing side surfaces of the bottom electrodes, the support holes including first support holes and second support holes that are spaced apart from each other, the first and second support holes having different shapes from each other, and
   wherein the second support holes are only at an edge portion of the cell region.

2. The semiconductor device of claim 1, wherein the cell region has four sides arranged in a clockwise direction, and the second support holes are adjacent to at least one side of the four sides of the cell region.

3. The semiconductor device of claim 1, wherein:
   each of the bottom electrodes has a circular cross-section in a plan view; and
   the first support holes and the second support holes have polygonal cross-sections in the plan view, a cross-section of each of the first support holes and the second support holes being defined by connecting central points of the circular cross-sections of the bottom electrodes.

4. The semiconductor device of claim 1, wherein each of the first support holes and the second support holes has a flat sidewall.

5. The semiconductor device of claim 1, wherein the first support holes are at the edge portion of the cell region and at a center of the cell region.

6. The semiconductor device of claim 1, wherein:
   the bottom electrodes include memory bottom electrodes on the cell region and dummy bottom electrodes on the dummy region and on an edge of the cell region, only the memory bottom electrodes of the bottom electrodes to perform a memory function, and
   one of the first support holes or the second support holes exposes at least one of the dummy bottom electrodes and at least one of the memory bottom electrodes.

7. The semiconductor device of claim 6, wherein the support holes expose side surfaces of all of the memory bottom electrodes.

8. The semiconductor device of claim 1, wherein the first support holes and the second support holes are present on the cell region and absent on the dummy region.

9. The semiconductor device of claim 1, wherein a total number of the first support holes is greater than that of the second support holes.

10. The semiconductor device of claim 1, wherein the bottom electrodes have a pillar shape or a hollow cup shape.

11. A semiconductor device, comprising:
    bottom electrodes on a semiconductor substrate, the semiconductor substrate including a cell region and a dummy region; and
    a support pattern in contact with at least a part of each of the bottom electrodes, the support pattern connecting the bottom electrodes with one another,
    wherein the support pattern includes support holes exposing side surfaces of the bottom electrodes,
    wherein the bottom electrodes include memory bottom electrodes on the cell region and dummy bottom electrodes on the dummy region and on an edge of the cell region, only the memory bottom electrodes of the bottom electrodes to perform a memory function, and
    wherein one of the support holes exposes at least one of the dummy bottom electrodes and at least one of the memory bottom electrodes.

12. The semiconductor device of claim 11, wherein the support holes include first support holes and second support holes that are spaced apart from each other, the first and second support holes having different shapes from each other.

13. The semiconductor device of claim 12, wherein the second support holes are only at the of the cell region.

14. The semiconductor device of claim 12, wherein the first support holes are between the second support holes.

15. The semiconductor device of claim 12, wherein the cell region has four sides arranged in a clockwise direction, and the second support holes are only adjacent to at least one side of the four sides of the cell region.

16. The semiconductor device of claim 12, wherein:
    each of the bottom electrodes has a circular cross-section in a plan view;
    the first support holes have circular cross-sections in the plan view, cross-section of each of the first support holes being defined by connecting central points of the circular cross-sections of the bottom electrodes; and
    the second support holes have polygonal cross-sections in the plan view, a cross-section of each of the second support holes being defined by connecting central points of the circular cross-sections of the bottom electrodes.

17. A semiconductor device, comprising:
    bottom electrodes on a semiconductor substrate, the semiconductor substrate including a cell region and a dummy region; and
    a support pattern in contact with at least a part of each of the bottom electrodes, the support pattern connecting the bottom electrodes with one another,
    wherein the support pattern includes support holes exposing side surfaces of the bottom electrodes, the support holes including a plurality of first support holes, at least one second support hole, and at least one third support hole that are spaced apart from each other, the first to third support holes having different shapes from each other.

18. The semiconductor device of claim 17, wherein the cell region has four sides arranged in a clockwise direction, and the at least one second support hole is adjacent to at least one of the four sides of the cell region.

19. The semiconductor device of claim 18, wherein the cell region has four sides arranged in a clockwise direction, the at least one second support hole is adjacent to one of the four sides of the cell region, and the at least one third support hole is adjacent to another one of the four sides of the cell region.

20. The semiconductor device of claim 17, wherein the plurality of first support holes, the at least one second support hole, and the at least one third support hole are present on the cell region and absent on the dummy region.

* * * * *